US011744123B2

(12) United States Patent
Choi

(10) Patent No.: US 11,744,123 B2
(45) Date of Patent: Aug. 29, 2023

(54) ARRAY SUBSTRATE AND DISPLAY DEVICE WITH LIGHT BLOCKING LAYER INCLUDING SCATTERING PARTICLES

(71) Applicants: HEFEI BOE DISPLAY TECHNOLOGY CO., LTD., Anhui (CN); BOE TECHNOLOGY GROUP CO., LTD., Beijing (CN)

(72) Inventor: Seungjin Choi, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 17/255,084

(22) PCT Filed: May 26, 2020

(86) PCT No.: PCT/CN2020/092308
§ 371 (c)(1),
(2) Date: Dec. 22, 2020

(87) PCT Pub. No.: WO2020/238892
PCT Pub. Date: Dec. 3, 2020

(65) Prior Publication Data
US 2021/0249496 A1     Aug. 12, 2021

(30) Foreign Application Priority Data
May 28, 2019     (CN) .......................... 201910452288.9

(51) Int. Cl.
*H10K 59/126*     (2023.01)
*H10K 50/854*     (2023.01)
(Continued)

(52) U.S. Cl.
CPC .......... *H10K 59/126* (2023.02); *H10K 50/854* (2023.02); *H10K 71/00* (2023.02); *H10K 59/1201* (2023.02)

(58) Field of Classification Search
CPC ........... H01L 27/3272; H01L 2227/323; H01L 51/5268; H01L 51/56; H10K 59/1201;
(Continued)

(56) References Cited

U.S. PATENT DOCUMENTS

2011/0147757 A1* 6/2011 Kim .................... H01L 27/1255
257/E33.001
2012/0138937 A1* 6/2012 Jo ...................... H01L 51/0096
977/773

FOREIGN PATENT DOCUMENTS

| CN | 101410980 A | 4/2009 |
| CN | 102487128 A | 6/2012 |

(Continued)

OTHER PUBLICATIONS

First Office Action dated Nov. 2, 2020 corresponding to Chinese application No. 201910452288.9.
(Continued)

*Primary Examiner* — Matthew E. Gordon
(74) *Attorney, Agent, or Firm* — Nath, Goldberg & Meyer; Joshua B. Goldberg

(57) ABSTRACT

The present disclosure provides an array substrate, a method for manufacturing the array substrate and a display device, and belongs to the field of display technology. The array substrate of the present disclosure includes: a base substrate; a light-blocking layer disposed on the base substrate; a thin film transistor disposed on the light-blocking layer; an organic light-emitting diode which is disposed on the light-blocking layer and has a first electrode coupled to a drain electrode of the thin film transistor; the light-blocking layer is provided with a plurality of scattering particles, and
(Continued)

orthographic projections of at least a portion of the scattering particles on the base substrate are overlapped with an orthographic projection of the organic light-emitting diode on the base substrate, so as to scatter light emitted from the organic light-emitting diode.

13 Claims, 3 Drawing Sheets

(51) Int. Cl.
    *H10K 71/00* (2023.01)
    *H10K 59/12* (2023.01)
(58) Field of Classification Search
    CPC .. H10K 59/126; H10K 59/877; H10K 50/854; H10K 71/00; H10K 71/40; H10K 71/421; H10K 71/441
    USPC .......................................................... 257/40
    See application file for complete search history.

(56) References Cited

FOREIGN PATENT DOCUMENTS

| | | |
|---|---|---|
| CN | 106654046 A | 5/2017 |
| CN | 207097823 U | 3/2018 |
| CN | 108231847 A | 6/2018 |
| CN | 108257977 A | 7/2018 |
| CN | 108630727 A | 10/2018 |
| CN | 110137233 A | 8/2019 |
| KR | 20180025466 A | 3/2018 |

OTHER PUBLICATIONS

Second Office Action dated May 24, 2021 corresponding to Chinese application No. 201910452288.9.

* cited by examiner

ARRAY SUBSTRATE AND DISPLAY DEVICE WITH LIGHT BLOCKING LAYER INCLUDING SCATTERING PARTICLES

CROSS REFERENCE TO RELATED APPLICATIONS

This is a National Phase Application filed under 35 U.S.C. 371 as a national stage of PCT/CN2020/092308, filed May 26, 2020, an application claiming the benefit of Chinese Application No. 201910452288.9, filed May 28, 2019, the content of each of which is hereby incorporated by reference in its entirety.

TECHNICAL FIELD

The present application relates to the field of display technology, and particularly relates to an array substrate, a method for manufacturing the array substrate and a display device.

BACKGROUND

An organic light-emitting device (OLED) is a light-emitting device in which an organic solid semiconductor is used as a light-emitting material, and has advantages of being manufactured by a simple process, low cost, low power consumption, high brightness, wide working temperature range, and the like, so that the OLED has a wide application prospect.

SUMMARY

The present disclosure provides an array substrate, a method for manufacturing the array substrate and a display device.

The array substrate of the present disclosure includes: a base substrate; a light-blocking layer disposed on the base substrate; a thin film transistor disposed on the light-blocking layer; an organic light-emitting diode which is disposed on the light-blocking layer and has a first electrode coupled to a drain electrode of the thin film transistor; the light-blocking layer is provided with a plurality of scattering particles, and orthographic projections of at least a portion of the scattering particles on the base substrate are overlapped with an orthographic projection of the organic light-emitting diode on the base substrate, so as to scatter light emitted from the organic light-emitting diode.

In an embodiment, the light-blocking layer includes a transparent conductive layer disposed on the base substrate and a light-blocking metal layer disposed on the transparent conductive layer; where the transparent conductive layer includes a first part and a second part, and the light-blocking metal layer is provided only on the first part; an orthographic projection of the light-blocking metal layer on the base substrate is at least overlapped with an orthographic projection of an active layer of the thin film transistor on the base substrate; an orthographic projection of the transparent conductive layer on the base substrate covers an orthographic projection of an area, where the thin film transistor and the organic light-emitting diode are located, on the base substrate; the second part of the transparent conductive layer corresponds to an area where the organic light-emitting diode is located, and are formed with the scattering particles.

In an embodiment, a material of the transparent conductive layer includes: indium tin oxide or indium zinc oxide.

In an embodiment, the scattering particles are metallic indium particles.

In an embodiment, the array substrate further includes a storage capacitor disposed on the base substrate; a first electrode of the storage capacitor and a source electrode and the drain electrode of the thin film transistor are disposed in a same layer and are made of a same material; a second electrode of the storage capacitor and the active layer of the thin film transistor are integrally formed as a piece.

In an embodiment, an orthographic projection of the light-blocking metal layer on the base substrate covers an orthographic projection of the storage capacitor on the base substrate.

In an embodiment, the array substrate further includes a buffer layer disposed on the light-blocking metal layer and the second part of the transparent conductive layer; the active layer and the second electrode of the storage capacitor disposed on the buffer layer; a gate insulating layer and a gate electrode disposed on the active layer; a passivation layer disposed on the gate insulating layer and the gate electrode; the source electrode, the drain electrode and the first electrode of the storage capacitor disposed on the passivation layer, where the source electrode and the drain electrode are respectively coupled to the active layer through via holes in the passivation layer; a planarization layer disposed on the drain electrode, the source electrode and the first electrode of the storage capacitor; the first electrode of the organic light-emitting diode disposed on the planarization layer; and a light-emitting layer disposed on the first electrode and a second electrode of the organic light-emitting diode disposed on the light-emitting layer.

In an embodiment, the first electrode of the organic light-emitting diode is a transparent electrode.

The method for manufacturing the array substrate provided by the present disclosure includes: forming a light-blocking layer on a base substrate; forming a pattern including layer structures of a thin film transistor on the light-blocking layer; forming layer structures of an organic light-emitting diode on the layer structures of the thin film transistor; where the first electrode of the organic light-emitting diode is coupled to the drain electrode of the thin film transistor; the forming the light-blocking layer on the base substrate includes: processing the light-blocking layer to form a plurality of scattering particles, so that orthographic projections of at least a portion of the scattering particles on the base substrate are overlapped with an orthographic projection of the organic light-emitting diode on the base substrate, so as to scatter light emitted from the organic light-emitting diode.

In an embodiment, the processing the light-blocking layer to form the plurality of scattering particles includes: successively depositing a transparent conductive material layer, a metal material layer and a photoresist layer on the base substrate, and exposing the photoresist layer to form a semi-exposed area corresponding to an area of the thin film transistor to be formed and a complete-exposed area corresponding to an area of the organic light-emitting diode to be formed; removing photoresist in the complete-exposed area and a portion of photoresist in the semi-exposed area, and etching to remove metal material in the complete-exposed area to form a pattern of the light-blocking metal layer; performing a plasma process on the transparent conductive material layer in the complete-exposed area to form the scattering particles in the transparent conductive material layer and form a transparent conductive layer; and removing residual photoresist.

In an embodiment, a material of the transparent conductive layer includes: indium tin oxide or indium zinc oxide.

In an embodiment, the performing the plasma process on the transparent conductive layer in the complete-exposed area to form the scattering particles in the transparent conductive layer includes: introducing $H_2$ or $SiH_4$ gas to perform the plasma process on the transparent conductive layer in the complete-exposed area to form the scattering particles.

In an embodiment, the method further includes: before forming the pattern including the layer structures of the thin film transistor on the light-blocking layer, forming a buffer layer on the light-blocking metal layer and the transparent conductive layer, in the complete-exposed area, formed with the scattering particles by the plasma process.

The present disclosure further provides a display device, including the above array substrate.

DESCRIPTION OF EMBODIMENTS

Figure 1:
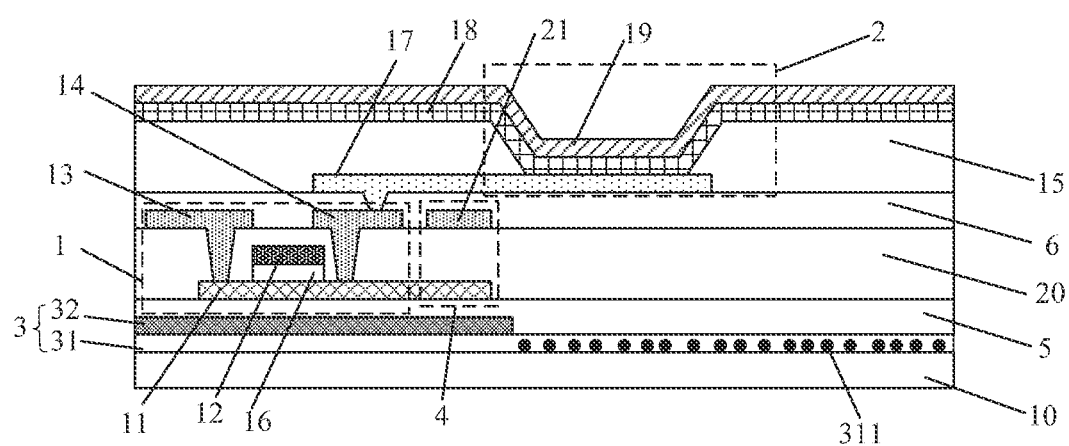
FIG. 1 is a schematic diagram of a structure of an array substrate according to an embodiment of the present disclosure.

In order that those skilled in the art will better understand technical solutions of the present disclosure, the following detailed description is given with reference to the accompanying drawings and the specific embodiments.

In related art, an OLED display device generally selects transparent glass or plastic as a base substrate material, and an anode layer, a light-emitting layer, and a cathode layer are successively disposed on the base substrate. For a bottom light-emitting type OLED device, light emitted from the light-emitting layer would reach air through the anode layer and the base substrate, so as to reach human's eyes. The light-emitting layer includes organic small molecule material, a refractive index of the light-emitting layer is approximately 1.6 to 1.7, the anode layer is an indium tin oxide (ITO) film, a refractive index of the anode layer is 1.8, the base substrate is glass or plastic, a refractive index of the base substrate ranges from 1.4 to 1.5, and thus both light being transmitted from the anode layer to the base substrate and light being transmitted from the base substrate to the air are light being transmitted from an optical dense medium to an optical sparse medium, total reflection phenomenon exists, light with an incident angle greater than a critical angle can be emitted from a side surface or consumed internally due to a total reflection, a proportion of light emitted from a front surface is greatly reduced, and light emitted from the side surface is concentrated in a certain wave band, a spectrum of the light emitted from the front surface is incomplete, resulting in a low external quantum efficiency.

It should be noted that the organic light-emitting diode generally includes a base substrate, a first electrode and a second electrode disposed on the base substrate, and a light-emitting layer disposed between the first electrode and the second electrode; where one of the first electrode and the second electrode is an anode, and the other is a cathode; in the embodiments of the present disclosure, the first electrode is taken as the anode, and the second electrode is taken as the cathode.

Organic light-emitting diodes are divided into a top light-emitting type and a bottom light-emitting type according to direction of light emitting; the bottom light-emitting type organic light-emitting diode emits light through a side of the base substrate, and the cathode of the organic light-emitting diode having such a structure generally employs a metal material as a reflective electrode.

The organic light-emitting diode in an array substrate of the embodiments of the present disclosure is of the bottom light-emitting type, and a specific description will be given in the following specific embodiments. A color of light emitted by the organic light-emitting diode in the embodiments may be white, or any color such as red, green, or blue.

Not only the organic light-emitting diode but also a switching element, i.e., a thin film transistor, controlling the organic light-emitting diode is included in the array substrate. The thin film transistor in the array substrate may be a top gate thin film transistor or a bottom gate thin film transistor, and the top gate thin film transistor is taken as an example in the embodiments of the present disclosure for description.

As shown in FIG. 1, an embodiment of the present disclosure provides an array substrate, including a base substrate 10, a thin film transistor 1 and an organic light-emitting diode 2 coupled to a drain electrode 14 of the thin film transistor 1 on the base substrate 10; the thin film transistor 1 is a top gate thin film transistor 1, and the organic light-emitting diode 2 is a bottom light-emitting type organic light-emitting diode 2. In order to prevent an active layer 11 of the thin film transistor 1 from being irradiated by external light to affect switching characteristics of the thin film transistor 1, since the active layer 11 of the top gate thin film transistor 1 is closer to the base substrate 10 than a gate electrode 12 thereof, a light-blocking layer 3 is disposed on a side of the thin film transistor 1 proximal to the base substrate 10.

Figure 2:
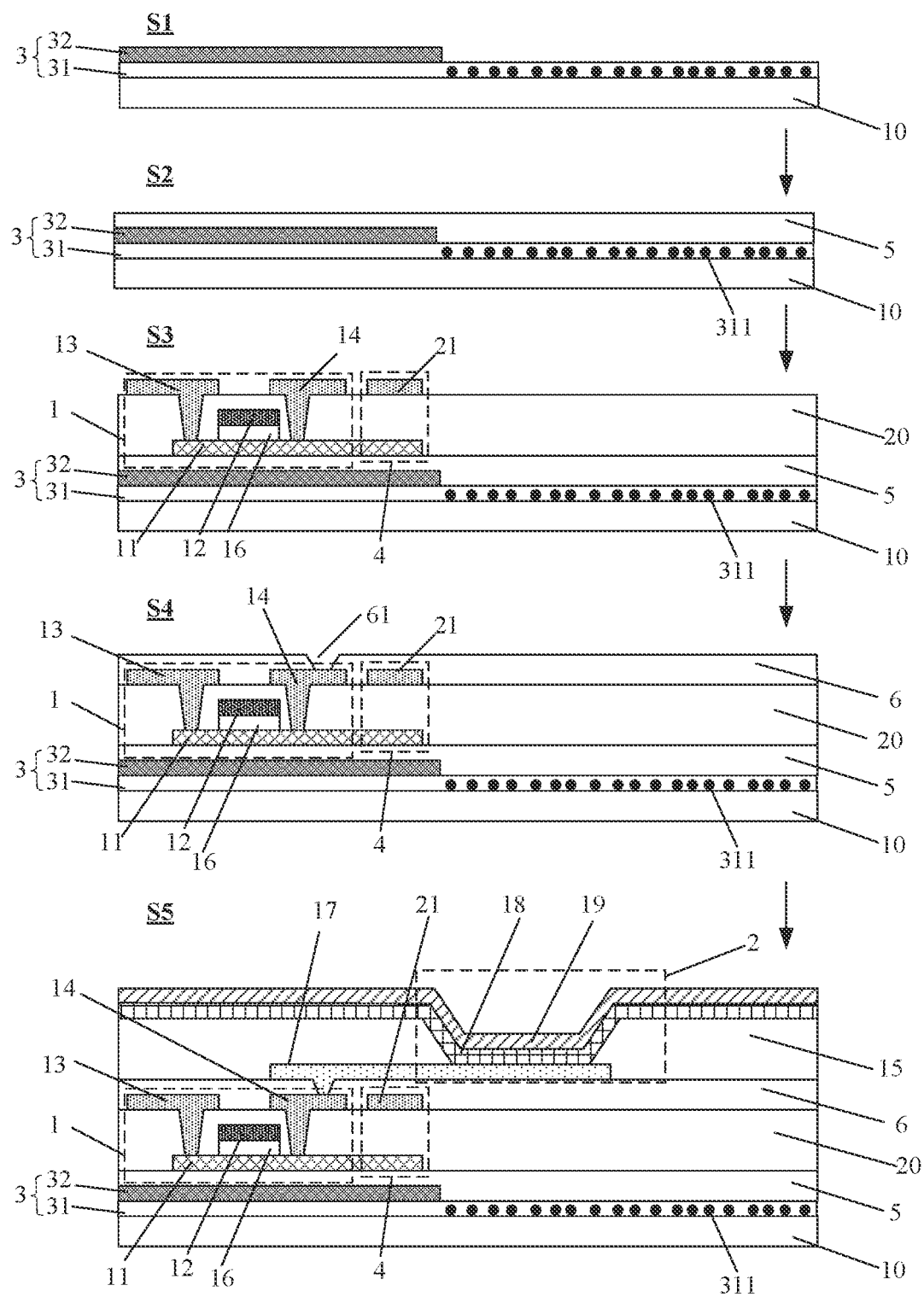
FIG. 2 is a schematic diagram of structures formed in steps of a method for manufacturing an array substrate according to an embodiment of the present disclosure.

In the present embodiment, the light-blocking layer 3 includes a transparent conductive layer 31 and a light-blocking metal layer 32 successively disposed on the base substrate 10; where an orthographic projection of the light-blocking metal layer 32 on the substrate 10base substrate 10 at least overlaps with an orthographic projection of the active layer 11 of the thin film transistor 1 on the substrate 10base substrate 10; an orthographic projection of the transparent conductive layer 31 on the substrate 10base substrate 10 covers an orthographic projection of an area, where the thin film transistor 1 and the organic electroluminescent light-emitting diode 2 are located, on the substrate 10base substrate 10; the light-blocking metal layer 32 does not extend to the area where the organic electroluminescent light-emitting diode 2 is located, that is, other upper layer structures may be directly disposed in the area where the organic electroluminescent light-emitting diode 2 is located, for example, a buffer layer 5 may be directly formed on the transparent conductive layer as shown in FIGS. 1 and 2. The transparent conductive layer 31 is formed with scattering particles 311 at a position corresponding to the area where the organic electroluminescent light-emitting diode 2 is located, so that light emitted by the organic electroluminescent light-emitting diode 2 is scattered by the scattering particles 311 of the transparent conductive layer 31, and the scattered light is emitted out through the substrate 10base substrate 10, which can greatly improve light extraction efficiency of the organic electroluminescent light-emitting diode 2. In addition, during the transparent conductive layer 31 being formed with the scattering particles 311 at the position corresponding to the area where the organic electroluminescent light-emitting diode 2 is located, the light-blocking metal layer 32 can be used as a mask for forming the scattering particles 311 in the transparent conductive layer 31, so that the number of masks is not increased during manufacturing the array substrate of the present embodiment, that is, not too much process cost is increased.

A material of the transparent conductive layer 31 includes, but is not limited to, indium tin oxide, and a corresponding transparent conductive material, for example, indium zinc oxide, may be adopted according to specific process requirements of the array substrate.

The array substrate of the present embodiment may further include a storage capacitor 4 and other elements. Specifically, a first electrode of the storage capacitor 4 is disposed in the same layer as a source electrode 13 and the drain electrode 14 of the thin film transistor 1, and materials of them are the same; a second electrode of the storage capacitor 4 is integrally formed with the active layer 11 of the thin film transistor 1. That is, the storage capacitor 4 can be formed while forming the thin film transistor 1, so that process steps can be simplified and the process cost can be reduced.

Specifically, as shown in FIG. 1, the array substrate of the embodiment of the present disclosure includes: a base substrate 10; a transparent conductive layer 31 disposed on the base substrate 10 and a light-blocking metal layer 32 disposed on the transparent conductive layer 31 at a position corresponding to a position where a thin film transistor 1 is to be formed; a buffer layer 5 formed on the light-blocking metal layer 32 and a portion of the transparent conductive layer 31, on which the light-blocking metal layer 32 is not disposed, corresponding to an organic light-emitting diode 2 to be formed, where scattering particles 311 are disposed in a portion of the transparent conductive layer 31 on which the light-blocking metal layer 32 is not disposed; the thin film transistor 1 disposed on a portion of the buffer layer 5, on which the light-blocking metal layer 32 is disposed, which includes an active layer 11, a gate insulating layer 16, a gate electrode 12, a passivation layer 20, a source electrode 13, a drain electrode 14 and a second electrode 21 of the storage capacitor 4 disposed on the buffer layer 5; a planarization layer 6 on the source electrode 13, the drain electrode 14 and the second electrode 21 of the storage capacitor 4; a pixel defining layer 15 on the planarization layer 6, and the organic light-emitting diode 2 in an opening defined in the pixel defining layer 15, which includes an anode 17, a light-emitting layer 18, and a cathode 19. Materials of components of the array substrate are specifically described in the following method for manufacturing the array substrate.

An embodiment of the present disclosure provides a method for manufacturing an array substrate, which can be used to manufacture the array substrate of the above embodiment. The method includes the following steps:

forming a light-blocking layer 3 on a base substrate 10, where the light-blocking layer 3 has scattering particles 311 at a position corresponding to an area where an organic light-emitting diode 2 is to be formed, that is, the light-blocking layer 3 is processed to form the scattering particles 311, an orthographic projection of the organic light-emitting diode 2 on the base substrate 10 is overlapped with orthographic projections of at least a portion of the scattering particles 311 on the base substrate 10, and the scattering particles 311 are used to scatter light emitted from the organic light-emitting diode 2 to be formed later;

forming a pattern including layer structures of a thin film transistor 1 on the light-blocking layer 3;

forming layer structures of the organic light-emitting diode 2 on the layer structures of the thin film transistor 1, where an anode 17 of the organic light-emitting diode 2 is coupled to a drain electrode 14 of the thin film transistor 1.

It should be noted that after a source electrode 13 and the drain electrode 14 of the thin film transistor 1 are formed, a planarization layer 6 is usually formed, and then the layer structures of the organic light-emitting diode 2 are formed, so as to prevent the source electrode 13 and the drain electrode 14 of the thin film transistor 1 from directly contacting a material for forming a conductive structure of the organic light-emitting diode 2, which affects switching characteristics of the thin film transistor 1.

In the array substrate manufactured by the method for manufacturing the array substrate in the present embodiment, the light-blocking layer 3 has the scattering particles 311 at the position at least corresponding to the area where the organic light-emitting diode 2 is located, and the scattering particles 311 can scatter light emitted by the organic light-emitting diode 2, so that the light extraction efficiency of the organic light-emitting diode 2 can be improved. Moreover, the scattering particles 311 are parts of the light-blocking layer 3, that is, the scattering particles 311 obtained by processing the existing light-blocking layer 3, so that the number of masks in the manufacturing process is not increased, and the process cost is saved.

Figure 3:
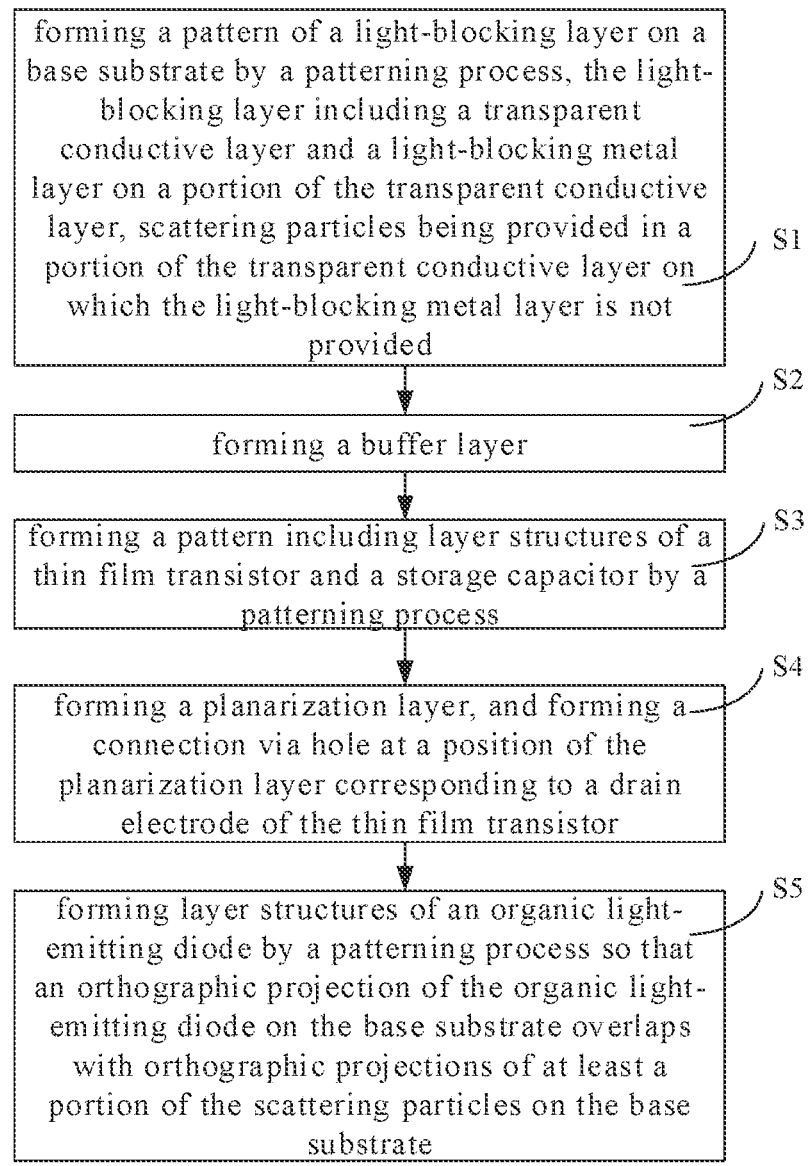
FIG. 3 is a flowchart of a method for manufacturing an array substrate according to an embodiment of the present disclosure.

Hereinafter, the method for manufacturing the array substrate in the present embodiment is specifically described by taking the light-blocking layer 3 in the present embodiment including a transparent conductive layer 31 and a metal light-blocking layer 32 as an example, as shown in FIGS. 2 and 3.

The method for manufacturing the array substrate in the present embodiment may include following steps S1 to S5.

S1, forming a pattern of a light-blocking layer 3 on a base substrate 10 by a patterning process.

The step S1 may specifically include the following steps S11 to S14.

S11, successively depositing a transparent conductive material layer, a metal material layer, and a photoresist layer on the base substrate 10, and exposing the photoresist layer by using a half-exposure or gray-scale mask to form a semi-exposed area corresponding to an area where a thin film transistor 1 is to be formed and a complete-exposed area corresponding to an area where an organic light-emitting diode 2 is to be formed.

S12, removing photoresist in the complete-exposed area and a portion of photoresist in the semi-exposed area, and etching to remove metal material in the complete-exposed area, thereby forming the pattern of the light-blocking metal layer 32.

S13, performing a plasma process on the transparent conductive material layer in the complete-exposed area, and forming scattering particles 311 in the transparent conductive material layer, thereby forming the transparent conductive layer 31.

The transparent conductive material layer is made of a material including, but not limited to, indium tin oxide (ITO) or indium zinc oxide (IZO), and a corresponding transparent conductive material may be used according to specific process requirements of the array substrate. The step S13 may include: introducing $H_2$ or $SiH_4$ gas, and performing the plasma process on the transparent conductive material layer in the complete-exposed area to form the scattering particles 311, and thus forming the transparent conductive layer 31 including the scattering particles 311. For example, when ITO is used to form the transparent conductive material layer, the ITO reacts with $H_2$ or $SiH_4$ to form metallic indium (In) condensed into particles, that is, a transparent conductive material layer having a certain haze is formed, so that the transparent conductive layer 31 having scattering particles is formed. Process parameters of the plasma process may be set according to actual needs, and generally, the stronger an intensity of the plasma process is, and the longer the time duration of the plasma process is, the larger the formed scattering particles are, the higher a density of the scattering particles is, and the better a scattering effect is, but the higher the density of the scattering particles is, the lower a transmittance is, so the process parameters of the plasma process are generally set according to actual needs.

As can be seen from FIG. 1, the transparent conductive layer 3 can be seen as including two different portions, i.e., a first portion in which the scattering particles 311 are disposed for scattering light emitted from the organic light-emitting diode so that more light is emitted from the side of the base substrate 10, increasing the light extraction efficiency, and the first portion is not disposed with the light-blocking metal layer 32 thereon; a second portion in which no scattering particles 311 are disposed, but the light-blocking metal layer 32 is formed thereon for preventing adverse effects of external light on an active layer 11.

S14, removing residual photoresist to form the light-blocking layer 3.

S2, forming a buffer layer 5, where the buffer layer 5 may be a single-layer film structure of a material such as silicon oxide or silicon nitride, or a composite film structure of silicon oxide and silicon nitride.

S3, forming a pattern including layer structures of the thin film transistor 1 and a storage capacitor 4 through a patterning process.

The step S3 may specifically include the following steps S31 to S34.

S31, forming a pattern including the active layer 11 of the thin film transistor 1 and a first electrode of the storage capacitor 4 through a single patterning process, where the first electrode of the storage capacitor 4 is integrally formed with the active layer 11.

S32, successively forming a gate insulating material layer and a gate metal material layer, and forming a pattern including a gate insulating layer 16 and a gate electrode 12 through a single patterning process.

S33, forming a passivation layer 20, and etching to form via holes at positions of the passivation layer 20 corresponding to contact areas of the active layer 11 respectively for a source electrode 13 and a drain electrode 14, where the passivation layer may be a single-layer film structure of a material such as silicon oxide or silicon nitride, or a composite film structure of silicon oxide and silicon nitride.

S34, forming a pattern including the source electrode 13 and the drain electrode 14 of the thin film transistor 1 and a second electrode of the storage capacitor 4 through a patterning process; where the source electrode 13 and the drain electrode 14 are coupled to the active layer 11 through respective via holes.

S4, forming a planarization layer 6, and forming a connection via hole 61 at a position of the planarization layer 6 corresponding to the drain electrode 14 of the thin film transistor 1, the planarization layer 6 may be a single-layer film structure of a material such as silicon oxide or silicon nitride, or a composite film structure of silicon oxide and silicon nitride.

S5, forming layer structures of the organic light-emitting diode 2 through a patterning process so that an orthographic projection of the organic light-emitting diode 2 on the base substrate 10 overlaps with orthographic projections of at least a portion of the scattering particles 311 on the base substrate 10.

The step S5 may specifically include the following steps S51 to S54.

S51, forming a pattern including an anode 17 of the organic light-emitting diode 2 through a patterning process, the anode 17 being coupled to the drain electrode 14 of the thin film transistor 1 through the connection via hole 61 formed in the step S4.

S52, forming a pixel defining layer 15, and forming a housing part at a position of the pixel defining layer 15 corresponding to the anode 17.

S53, forming a light-emitting layer 18, where the light-emitting layer 18 at least covers the housing part.

S54, forming a cathode 19 of the organic light-emitting diode 2.

Thus, manufacturing of layer structures of the array substrate is completed.

An embodiment of the present disclosure further provides a display device, which includes the array substrate of the above embodiment, so that a display effect of the display device is better.

The display device may be any product or component with a display function, such as an electronic paper, an OLED panel, a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. An array substrate, comprising:
   a base substrate;
   a light-blocking layer disposed on the base substrate;
   a thin film transistor disposed on the light-blocking layer;
   an organic light-emitting diode which is disposed on the light-blocking layer and has a first electrode coupled to a drain electrode of the thin film transistor; wherein,
   the light-blocking layer is provided with a plurality of scattering particles, and orthographic projections of at least a portion of the scattering particles on the base substrate are overlapped with an orthographic projection of the organic light-emitting diode on the base substrate, so as to scatter light emitted from the organic light-emitting diode,
   wherein the light-blocking layer comprises a transparent conductive layer disposed on the base substrate and a light-blocking metal layer disposed on the transparent conductive layer, the transparent conductive layer includes a first part and a second part, and the light-blocking metal layer is disposed only on the first part,
   an orthographic projection of the light-blocking metal layer on the base substrate is at least overlapped with an orthographic projection of an active layer of the thin film transistor on the base substrate, but not overlapped with the orthographic projection of the organic light-emitting diode on the base substrate, the array substrate further comprises: a storage capacitor disposed on the base substrate, wherein the orthographic projection of the light-blocking metal layer on the base substrate further covers an orthographic projection of the storage capacitor on the base substrate.

2. The array substrate of claim 1, wherein a material of the transparent conductive layer comprises: indium tin oxide or indium zinc oxide.

3. The array substrate of claim 1, wherein the scattering particles are metallic indium particles.

4. The array substrate of claim 1, wherein, a first electrode of the storage capacitor and a source electrode and the drain electrode of the thin film transistor are disposed in a same layer and are made of a same material; a second electrode of the storage capacitor and the active layer of the thin film transistor are integrally formed as a piece.

5. The array substrate of claim 1, further comprising: a buffer layer disposed on the light-blocking metal layer and the second part of the transparent conductive layer;

the active layer and the second electrode of the storage capacitor disposed on the buffer layer;

a gate insulating layer and a gate electrode disposed on the active layer;

a passivation layer disposed on the gate insulating layer and the gate electrode;

the source electrode, the drain electrode, and the first electrode of the storage capacitor disposed on the passivation layer, wherein the source electrode and the drain electrode are respectively coupled to the active layer through via holes in the passivation layer;

a planarization layer disposed on the drain electrode, the source electrode and the first electrode of the storage capacitor;

a first electrode of the organic light-emitting diode disposed on the planarization layer; and a light-emitting layer disposed on the first electrode and a second electrode of the organic light-emitting diode disposed on the light-emitting layer.

6. The array substrate of claim 5, wherein the first electrode of the organic light-emitting diode is a transparent electrode.

7. A display device, comprising the array substrate of claim 1.

8. The array substrate of claim 1, wherein an orthographic projection of the transparent conductive layer on the base substrate covers an orthographic projection of an area, where the thin film transistor and the organic light-emitting diode are located, on the base substrate.

9. The array substrate of claim 1, wherein the second part of the transparent conductive layer corresponds to a position of an area, where the organic light-emitting diode is located, and is provided with the scattering particles.

10. A method for manufacturing an array substrate, comprising:

forming a light-blocking layer on a base substrate;

forming a pattern including layer structures of a thin film transistor and a storage capacitor on the light-blocking layer;

forming layer structures of an organic light-emitting diode on the layer structures of the thin film transistor; wherein, a first electrode of the organic light-emitting diode is coupled to a drain electrode of the thin film transistor; and wherein, the forming the light-blocking layer on the base substrate comprises:

processing the light-blocking layer to form a plurality of scattering particles, so that orthographic projections of at least a portion of the scattering particles on the base substrate are overlapped with an orthographic projection of the organic light-emitting diode on the base substrate, and the scattering particles are used for scattering light emitted from the organic light-emitting diode, wherein the processing the light-blocking layer to form the plurality of scattering particles comprises:

successively depositing a transparent conductive material layer, a metal material layer and a photoresist layer on the base substrate, and exposing the photoresist layer to form a semi-exposed area corresponding to an area where the thin film transistor and the storage capacitor are to be formed and a complete-exposed area corresponding to an area where the organic light-emitting diode is to be formed;

removing photoresist in the complete-exposed area and a portion of photoresist in the semi-exposed area, and etching to remove metal material in the complete-exposed area to form a pattern of the light-blocking metal layer, so that an orthographic projection of the light-blocking metal layer on the base substrate is at least overlapped with an orthographic projection of an active layer of the thin film transistor on the base substrate, covers an orthographic projection of the storage capacitor on the base substrate, but is not overlapped with the orthographic projection of the organic light-emitting diode on the base substrate;

performing a plasma process on the transparent conductive material layer in the complete-exposed area to form scattering particles in the transparent conductive material layer so as to form a transparent conductive layer, wherein the transparent conductive layer includes a first part and a second part, and the light-blocking metal layer is disposed only on the first part;

removing residual photoresist.

11. The method of claim 10, wherein a material of the transparent conductive layer comprises: indium tin oxide or indium zinc oxide.

12. The method of claim 11, wherein the performing the plasma process on the transparent conductive layer in the complete-exposed area to form the scattering particles in the transparent conductive layer comprises:

introducing $H_2$ or $SiH_4$ gas to perform the plasma process on the transparent conductive layer in the complete-exposed area so as to form the scattering particles.

13. The method of claim 12, further comprising:

before forming the pattern including the layer structures of the thin film transistor on the light-blocking layer, forming a buffer layer on the light-blocking metal layer and the transparent conductive layer in the complete-exposed area, in which the scattering particles are formed by the plasma process.

* * * * *